United States Patent
Okamura

(10) Patent No.: US 8,450,908 B2
(45) Date of Patent: May 28, 2013

(54) MULTI-LAYER PIEZOELECTRIC ELEMENT WITH METAL PARTS OR CERAMIC PARTS BONDED TO ONLY ONE PIEZOELECTRIC MATERIAL LAYER

(75) Inventor: Takeshi Okamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 541 days.

(21) Appl. No.: 12/675,387

(22) PCT Filed: Aug. 25, 2008

(86) PCT No.: PCT/JP2008/065085
§ 371 (c)(1),
(2), (4) Date: Jun. 14, 2010

(87) PCT Pub. No.: WO2009/028444
PCT Pub. Date: Mar. 5, 2009

(65) Prior Publication Data
US 2010/0276511 A1    Nov. 4, 2010

(30) Foreign Application Priority Data
Aug. 29, 2007  (JP) ................................ 2007-223214

(51) Int. Cl.
*H01L 41/083* (2006.01)
(52) U.S. Cl.
CPC .................................. *H01L 41/0838* (2013.01)
USPC ......................................... 310/328; 310/366
(58) Field of Classification Search
CPC .................................................. H01L 41/0838
USPC .................................................. 310/328, 366
See application file for complete search history.

(56) References Cited

U.S. PATENT DOCUMENTS 7,358,655 B2    4/2008  Ragossnig et al. ............ 310/358
(Continued)

FOREIGN PATENT DOCUMENTS

EP         1942532 A1    7/2008
JP       2005-129871     5/2005
(Continued)

OTHER PUBLICATIONS

Extended European search report dated Nov. 22, 2012 issued in corresponding European application 08792693.7 cites the foreign patent documents listed above.

*Primary Examiner* — J. San Martin
(74) *Attorney, Agent, or Firm* — DLA Piper LLP (US)

(57) ABSTRACT

A multi-layer piezoelectric element having high durability of which amount of displacement is suppressed from varying even when operated continuously over a long period of time with a higher electric field under a high pressure is provided. The multi-layer piezoelectric element comprising a multi-layer structure in which a plurality of piezoelectric material layers and a plurality of metal layers are stacked alternately one on another, wherein the plurality of metal layers comprises internal electrodes and low-rigidity metal layer that has rigidity lower than those of the piezoelectric material layer and the internal electrode, wherein the low-rigidity metal layer comprises a plurality of metal parts that are separated from each other, and wherein at least one of the metal parts is bonded with only one piezoelectric material layer among the two piezoelectric material layers that adjoin in the stacking direction.

13 Claims, 8 Drawing Sheets

U.S. PATENT DOCUMENTS

| | | |
|---|---|---|
| 8,212,451 B2 | 7/2012 | Inagaki et al. |
| 8,288,921 B2 * | 10/2012 | Terazono et al. ............. 310/328 |
| 2006/0238073 A1 | 10/2006 | Rogossnig et al. ........... 310/328 |
| 2007/0080612 A1 | 4/2007 | Terazono et al. ............. 310/366 |
| 2007/0278907 A1 | 12/2007 | Kondo et al. ................. 310/364 |
| 2010/0288849 A1 * | 11/2010 | Okamura ................... 239/102.2 |
| 2010/0294853 A1 * | 11/2010 | Okamura ................... 239/102.2 |
| 2010/0320284 A1 * | 12/2010 | Okamura ................... 239/102.2 |

FOREIGN PATENT DOCUMENTS

| | | |
|---|---|---|
| JP | 2006-013437 | 1/2006 |
| JP | 2007-027692 | 2/2007 |
| JP | 2007-043094 | 2/2007 |
| WO | 2007037377 A1 | 4/2007 |
| WO | WO 2007037377 A1 * | 4/2007 |
| WO | 2008053569 A1 | 5/2008 |

\* cited by examiner

MULTI-LAYER PIEZOELECTRIC ELEMENT WITH METAL PARTS OR CERAMIC PARTS BONDED TO ONLY ONE PIEZOELECTRIC MATERIAL LAYER

CROSS-REFERENCE TO THE RELATED APPLICATIONS

This application is a national stage of international application No. PCT/JP2008/065085, filed on Aug. 25, 2008, and claims the benefit of priority under 35 USC 119 to Japanese Patent Application No. 2007-223214, filed on Aug. 29, 2007, the entire contents of which are incorporated herein by reference.

TECHNICAL FIELD

The present invention relates to a multi-layer piezoelectric element, an ejection apparatus and a fuel ejection system, for example a multi-layer piezoelectric element used as the drive element (piezoelectric actuator) for fuel ejection apparatus of automobile engine, liquid ejection apparatus of ink jet printer or the like, precision positioning device for an optical apparatus or vibration preventing device, as a sensor element used in combustion pressure sensor, knocking sensor, acceleration sensor, load sensor, ultrasonic sensor, pressure sensor, yaw rate sensor or the like, or as a circuit component mounted in piezoelectric gyro, piezoelectric switch, piezoelectric transducer, piezoelectric breaker or the like, and an ejection apparatus and a fuel ejection system that employ the multi-layer piezoelectric element.

BACKGROUND

There have been demands for a greater amount of displacement achieved in a multi-layer piezoelectric element under a high pressure as well as size reduction. As a result, the multi-layer piezoelectric element is required to be operable under harsher conditions, namely continuous operation over a long period of time with higher voltage applied thereto.

Unlike other multi-layer electronic components such as capacitor, the multi-layer piezoelectric element itself undergoes continuous changes in dimension during operation. A large amount of displacement of the multi-layer piezoelectric element as a whole is achieved as all piezoelectric material layers act while maintaining firm contact with each other with internal electrodes interposed therebetween. As a result, the element is subject to intense stresses.

As a solution to the problem described above, such an element has been proposed as a porous layer is provided as a target fracture layer in the inside of the piezoelectric material layer (Patent Document 1). Patent document 1 describes an attempt to mitigate the stress generated in each of the piezoelectric material layers by causing the multi-layer piezoelectric element to break in the target fracture layer. Such a multi-layer piezoelectric element has also been proposed that has target fracture layer in the inside of the internal electrode, rather than in the piezoelectric material layer.

Patent Document 1: Kohyo (National Publication of Translated Version) No. 2006-518934

DISCLOSURE OF THE INVENTION

Problems to be Solved by the Invention

The method disclosed in Patent Document 1 is capable of relieving the stress generated in the piezoelectric material layer to some extent. However, the multi-layer piezoelectric element is required to be operable under the condition of a higher voltage applied thereto. When the target fracture layer is used under such a harsh condition, cracks generated in the target fracture layer may grow in an unpredictable direction.

This is because there is a possibility of a crack generated in the target fracture layer to grow into the piezoelectric material layer, since the target fracture layer and the piezoelectric material layer are formed from the same material, in case the target fracture layer is provided in the inside of the piezoelectric material layer as described in Patent Document 1. In case the target fracture layer is provided in the inside of the internal electrode, on the other hand, crack may be generated between grains that adjoin the target fracture layer, among the piezoelectric crystal grains that form the piezoelectric material layer.

When compared to the crystal grains of the piezoelectric material layer, the internal electrode and the target fracture layer are larger and continuous layer. While each of the grains that form the piezoelectric material layer undergoes piezoelectric displacement when the multi-layer piezoelectric element is electrified, grains that bond with the target fracture layer among these grains are constrained by the internal electrode and therefore cannot deform independently in response to the drive voltage. Accordingly, stress is generated between these grains due to the constraints by the target fracture layer. As a result, when the multi-layer piezoelectric element is operated under a high voltage that is envisioned for the operating condition in the near future, there may occur such a case that cracks grow between the grains but do not grow only into the target fracture layer.

When a crack grows between the grains and reaches each of internal electrodes that adjoin in the stacking direction, short circuiting may occur between the internal electrodes of opposing polarities, resulting in a decrease in the amount of displacement. In case the piezoelectric element is operated under a high voltage and a high pressure, in particular, the piezoelectric element is subjected to instantaneous stress of high intensity and therefore it is difficult to stabilize the direction of crack. As a result, there is a need to more effectively mitigate the stress generated in the element.

The present invention has been made to solve the problems described above, and an object thereof is to provide a multi-layer piezoelectric element having high durability of which amount of displacement is suppressed from varying even when operated continuously over a long period of time with a higher electric field under a high pressure, and an ejection apparatus and a fuel ejection system that employ the multi-layer piezoelectric element.

Means for Solving the Problems

The present inventors have intensively studied and found that stress generated in the multi-layer piezoelectric element, when the piezoelectric element is operated under a high voltage and a high pressure, can be effectively dispersed by providing low-rigidity metal layer comprising a plurality of metal parts which are separated from each other.

A first multi-layer piezoelectric element of the present invention comprises a multi-layer structure in which a plurality of piezoelectric material layers and a plurality of metal layers are stacked alternately one on another, wherein the plurality of metal layers comprise internal electrodes and low-rigidity metal layer that has rigidity lower than those of the piezoelectric material layer and the internal electrode, wherein the low-rigidity metal layer comprises a plurality of metal parts that are separated from each other, and at least one of the metal parts is bonded with only one piezoelectric material layer among the two piezoelectric material layers that adjoin in the stacking direction.

A second multi-layer piezoelectric element of the present invention comprises a multi-layer structure in which a plurality of ceramic layers and a plurality of internal electrodes are stacked alternately one on another, wherein the plurality of ceramic layers comprise piezoelectric material layers and low-rigidity ceramic layer that has rigidity lower than those of the piezoelectric material layer and the internal electrode, the low-rigidity ceramic layer comprises a plurality of ceramic parts that are separated from each other, and at least one of the ceramic parts is bonded with only one piezoelectric material layer among the two piezoelectric material layers that adjoin in the stacking direction.

The ejection apparatus of the present invention comprises a container comprising an ejection hole; and one of the multi-layer piezoelectric elements described above housed in the container, wherein the ejection apparatus configured to eject a liquid filled in the container through the ejection hole by an operation of the multi-layer piezoelectric element.

The fuel ejection system of the present invention includes a common rail that stores a high-pressure fuel, an ejection apparatus described above that ejects the fuel stored in the common rail, a pump that supplies the high-pressure fuel to the common rail and an ejection control unit that supplies a drive signal to the ejection apparatus.

Advantage

The present invention makes it possible to provide a multi-layer piezoelectric element that has high durability since the amount of displacement is suppressed from varying even when the element is operated continuously for a long period of time under a high voltage and a high pressure, and an ejection apparatus and a fuel ejection system that employ the multi-layer piezoelectric element.

DESCRIPTION OF REFERENCE NUMERALS

| | |
|---|---|
| 1: | Multi-layer piezoelectric element |
| 3: | Piezoelectric material layer |
| 5: | Metal layer |
| 7: | Multi-layer structure |
| 9: | External electrode |
| 11: | Internal electrode |
| 13: | Low-rigidity metal layer |
| 15: | Metal part |
| 17: | Piezoelectric crystal grains |
| 19: | Bonding material |
| 21: | Ceramic layer |
| 23: | Low-rigidity ceramic layer |
| 25: | Ceramic part |
| 27: | Void |
| 29: | Power supply section |
| 31: | Ejection apparatus |
| 33: | Ejection hole |
| 35: | Housing |
| 37: | Needle valve |
| 39: | Fuel passage |
| 41: | Cylinder |
| 43: | Piston |
| 45: | Belleville spring |
| 47: | Fuel ejection system |
| 49: | Common rail |
| 51: | Pump |
| 53: | Ejection control unit |
| 55: | Fuel tank |

DETAILED DESCRIPTION OF THE PREFERRED EMBODIMENT

Figure 1:
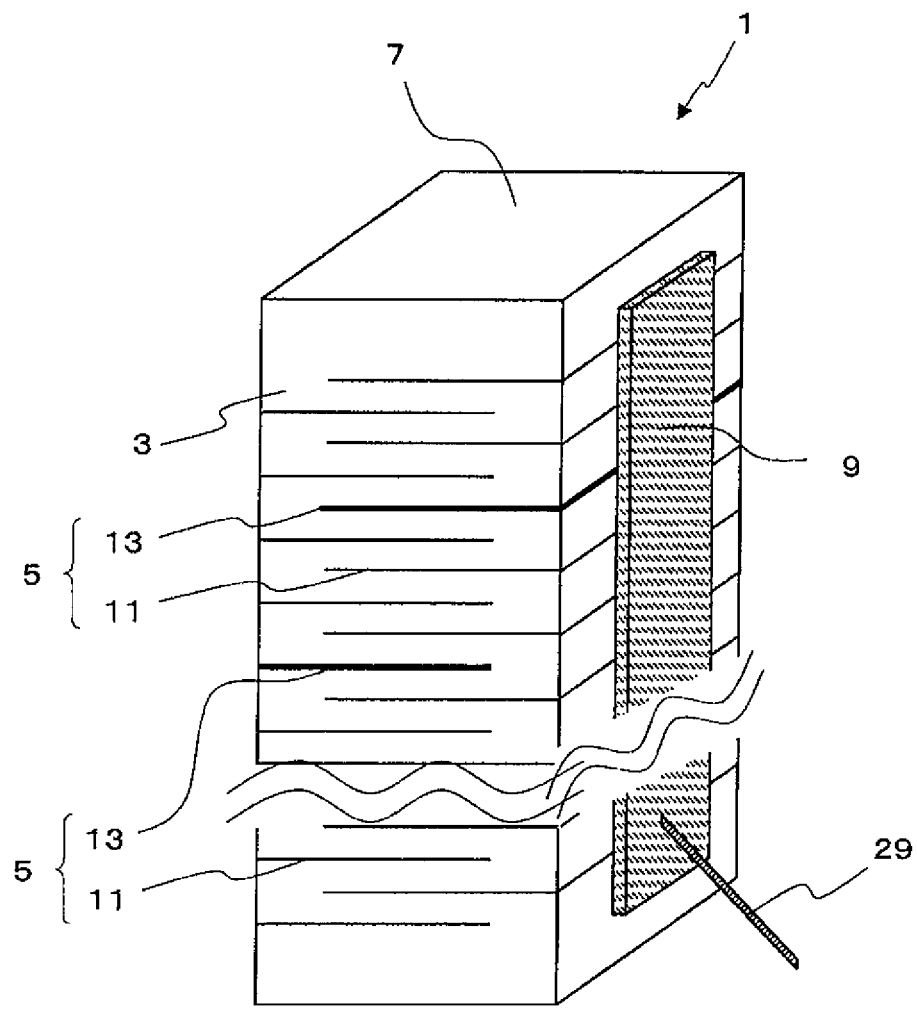
FIG. 1 is a perspective view showing an example of an embodiment of the first multi-layer piezoelectric element according to the present invention.
Figure 2:
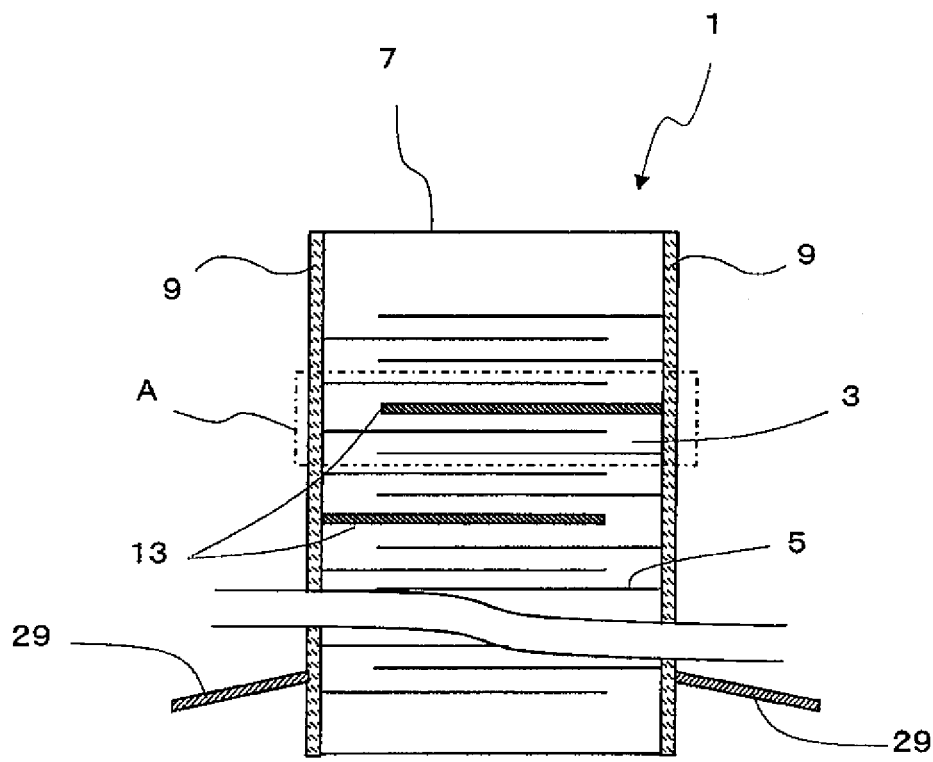
FIG. 2 is a sectional view parallel to the stacking direction of the multi-layer piezoelectric element according to the embodiment shown in FIG. 1.
Figure 3:
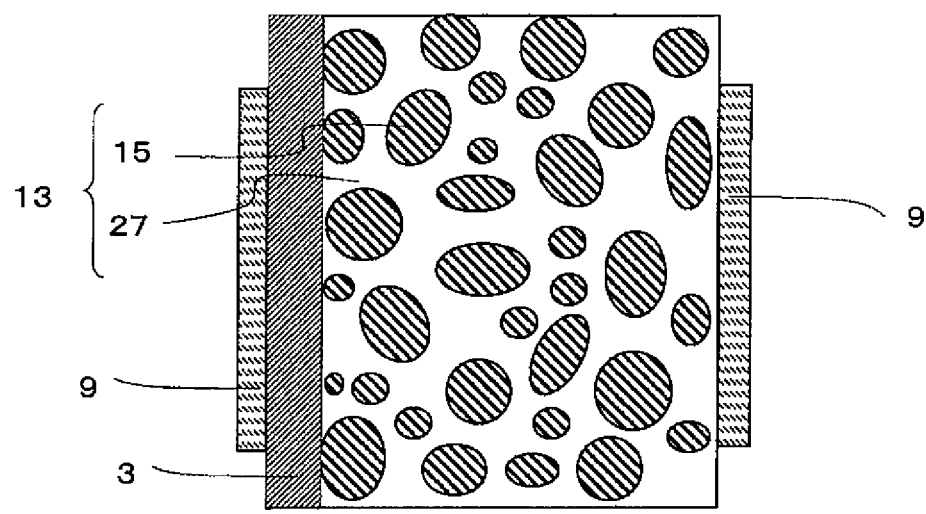
FIG. 3 is a sectional view, including low-rigidity metal layer, along direction perpendicular to the stacking direction of the multi-layer piezoelectric element according to the embodiment shown in FIG. 1.

The first multi-layer piezoelectric element according to the present invention will be described below with reference to the accompanying drawings. FIG. 1 is a perspective view showing an example of embodiment of the first multi-layer piezoelectric elements of the present invention. FIG. 2 shows the multi-layer piezoelectric element according to the embodiment shown in FIG. 1, in a longitudinal sectional view parallel to the stacking direction. FIG. 3 shows the multi-layer piezoelectric element according to the embodiment shown in FIG. 1, in a cross sectional view that includes low-rigidity metal layer along a direction perpendicular to the stacking direction.

As shown in FIG. 1 to FIG. 3, the multi-layer piezoelectric element 1 (this may hereafter be referred to also as element 1) of this embodiment comprises a multi-layer structure 7 in which a plurality of piezoelectric material layer 3 and a plurality of metal layers 5 are stacked alternately one on another and external electrodes 9 formed on the side faces of the multi-layer structure 7. The plurality of metal layers 5 comprises internal electrodes 11 that are electrically connected to the external electrode 9 and low-rigidity metal layers 13 that have rigidity lower than those of the internal electrodes 11 and the piezoelectric material layer 3.

In this embodiment, the low-rigidity metal layer 13 is a layer of lower rigidity that has weaker bonding strength within the layer and/or between the adjacent layers compared to the piezoelectric material layer 3 and the internal electrode 11, and comprises a plurality of metal parts 15 that are separated from each other. There exist, for example, voids 27 between the metal parts 15. Ceramics or resin may also exist, instead of the voids 27, between the metal parts 15. Thus the low-rigidity metal layer 13 of the present invention may have various forms.

When the multi-layer piezoelectric element 1 is subjected to a strong extraneous impact or stress during operation of the multi-layer piezoelectric element 1, stress is absorbed by the low-rigidity metal layer 13. As a result, cracks are suppressed from occurring in the internal electrodes 11 and in the piezoelectric material layers 3, thereby suppressing short-circuiting from occurring between the internal electrodes 11 that adjoin each other in the stacking direction.

When the multi-layer piezoelectric element 1 is subjected to a greater stress, the low-rigidity metal layer 13 preferentially fractures. Since fracture of the low-rigidity metal layer 13 disperses the stress, it is made possible to suppress the internal electrodes and the piezoelectric material layers from being damaged.

Comparison of rigidity among the low-rigidity metal layer 13, the piezoelectric material layer 3 and the internal electrode 11 can be easily done by, for example, applying a load to the element in a direction perpendicular to the stacking direction. Specifically, a load may be applied to the element in a direction perpendicular to the stacking direction according to the procedure of JIS three-point bending test (JIS R 1601). What is needed is simply locate the position where fracture occurs in the element 1 during the test, and the position of fracture is where rigidity is the lowest in the element.

The multi-layer piezoelectric element 1 of this embodiment comprises the low-rigidity metal layer 13, and therefore fracture occurs preferentially in the low-rigidity metal layer 13 or in the interface between the low-rigidity metal layer 13 and the piezoelectric material layer 3, rather than in the piezoelectric material layer 3 and in the internal electrode 11 during the JIS three-point bending test. Thus evaluation can be done by observing where fracture takes place, whether in the piezoelectric material layer 3 and in the internal electrode 11, or in the low-rigidity metal layer 15 and in the interface between the low-rigidity metal layer 13 and the piezoelectric material layer 3.

Since it suffices to observe where fracture takes place in the element 1, problem of a test piece that is too small to be subjected to the JIS three-point bending test can be circumvented by preparing such a test piece as the element 1 has a square prism shape according to the JIS three-point bending test, placing the test piece across two supports disposed at a predetermined distance from each other, and applying a load at the center between the supports.

Low rigidity means a low Young's modulus. Young's modulus may be measured by, for example, nano-indentation method. Nano-Indenter II of Nano Instrument Inc., for example, may be used in the measurement. Young's modulus may be measured with this instrument by exposing the low-rigidity metal layer 13, the piezoelectric material layer 3 or the internal electrode 11 in a surface cut in a plane perpendicular or parallel to the stacking direction of the multi-layer structure 7.

Figure 4:
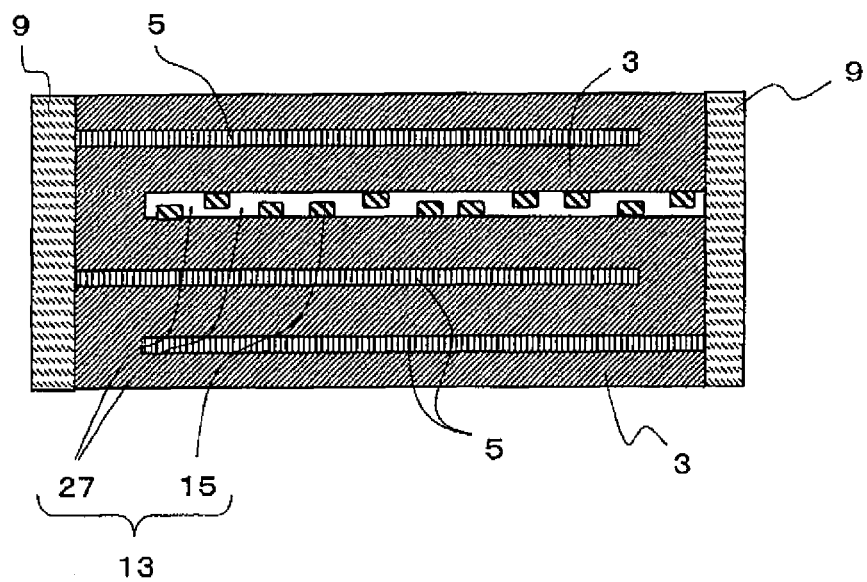
FIG. 4 is an enlarged sectional view of a region A according to the embodiment shown in FIG. 3.

FIG. 4 is an enlarged sectional view of a portion A where the low-rigidity metal layer 13 is disposed in the multi-layer piezoelectric element 1 according to the embodiment shown in FIG. 2. As shown in FIG. 3 and FIG. 4, the low-rigidity metal layer 13 comprises the voids 27 and a plurality of metal parts 15 that are separated from each other by the voids 27.

Since the low-rigidity metal layer 13 comprises such a constitution, bonding strength is low within the low-rigidity metal layer 13 and/or with the adjacent piezoelectric material layer 3, and therefore rigidity of the low-rigidity metal layer 13 can be made lower.

In the low-rigidity metal layer 13, since the piezoelectric material layer 3 is bonded only partially by the plurality of metal parts 15 that are separated from each other (scattered) via voids 27, the piezoelectric material layer 3 that makes contact with the low-rigidity metal layer 13 can deform relatively freely.

As a result, when the multi-layer piezoelectric element 1 is subjected to a stress, the stress is absorbed as the piezoelectric material layer 3 that makes contact with the low-rigidity metal layer 13 deforms. In the portion of the piezoelectric material layer 3 that makes contact with the metal part 15, the piezoelectric material layer 3 is suppressed from deforming. Therefore, tensile or compressive strain is generated in the metal part 15 and in a part of the piezoelectric material layer 3 where the metal part 15 makes contact, although the strain is transformed into thermal energy and is dispersed. Thus the low-rigidity metal layer 13 including the metal parts 15 dispersed therein mitigates the stress generated in the multi-layer piezoelectric element 1.

Since the plurality of metal parts 15 is separated from each other in the low-rigidity metal layer 13, cracks are suppressed from growing beyond the low-rigidity metal layer 13 and it is made possible to suppress the cracks from growing in unexpected directions.

It is preferable the metal parts 15 are formed evenly over the entire surface of the low-rigidity metal layer 13, so that strains generated in the piezoelectric material layer 3 are distributed uniformly when the low-rigidity metal layer 13 is viewed in the stacking direction. Formation of the low-rigidity metal layer 13 in this way improves the effect of relieving the multi-layer piezoelectric element 1 of the stress in various directions. This makes it possible to more reliably reduce the possibility of occurrence of such a crack that reaches the internal electrodes 11 of both polarities that adjoin in the stacking direction.

As shown in FIG. 4, in the multi-layer piezoelectric element according to the embodiment of the present invention, the low-rigidity metal layer comprises a plurality of metal parts that are separated from each other, and at least one of the metal parts 15 is bonded with only one piezoelectric material layer 3 among the two piezoelectric material layers 3 that adjoin in the stacking direction. In other words, at least one of the metal parts 15 of the multi-layer piezoelectric element 1 of this embodiment is bonded with only one piezoelectric material layer 3 and is not bonded with the other piezoelectric material layer 3. In the multi-layer piezoelectric element, the piezoelectric element is subjected to stress as the piezoelectric element is electrified and undergoes displacement. In the multi-layer piezoelectric element, in particular, the piezoelectric layer is subjected to a strong stress since each of the piezoelectric layers undergoes displacement and the entire element undergoes a large amount of displacement. At this time, in case every metal part 15 is bonded with the piezoelectric material layers 3 on both sides thereof, the two piezoelectric material layers 3 that adjoin in the stacking direction are constrained by a greater force. Thus there is a possibility of stress to be concentrated in the vicinity of the interface between the piezoelectric material layer 3 and the metal part 15 at the instant that the metal part 15 fractures.

In the multi-layer piezoelectric element of this embodiment, in contrast, stress can be effectively mitigated since some of the metal parts 15 are not bonded with the other piezoelectric material layer 3 as described above. This is because, when the element 1 is subjected to tensile stress, void is formed between the piezoelectric material layer 3 and the metal part 15 that is not bonded with this piezoelectric material layer 3, thereby releasing the stress in the void.

In the multi-layer piezoelectric element of this preferred embodiment, the metal part 15 is bonded with only one piezoelectric material layer 3 among the two piezoelectric material layers that adjoin in the stacking direction, and is not bonded with the other piezoelectric material layer 3, as described above, and therefore no force acts to constrain the two piezoelectric material layers 3 that adjoin the low-rigidity metal layer 13. This is because the low-rigidity metal layer 13 is not bonded with the other piezoelectric material layer 3. As a result, it is made possible to reduce the possibility of crack to be generated in the piezoelectric material layers 3 and more reliably mitigate the stress.

In case the element 1 is subjected to compressive stress, stress can be suppressed from being concentrated in the vicinity of the interface between the piezoelectric material layer 3 and the metal part 15, since the metal part 15 is not bonded with the piezoelectric material layers 3 and is not constrained by the piezoelectric material layers 3. This makes it possible to suppress the piezoelectric material layers 3 from breaking and the piezoelectric material layers 3 and the metal part 15 from, peeling off in the bonding therebetween. As a result, it is made possible to provide the multi-layer piezoelectric element 1 that operates stably with high reliability.

It can be determined whether the metal part 15 is bonded with the piezoelectric material layers 3 on one side and the other side thereof or not, by conducting the JIS three-point bending test described previously, or a three-point bending test based on the JIS three-point bending test, and observing the fracture surface. In the multi-layer piezoelectric element 1 of this embodiment, since the low-rigidity metal layer 13 is lower in rigidity than the piezoelectric material layer 3 and the internal electrodes 11, fracture occurs within the low-rigidity metal layer 13 and/or in the interface thereof with the adjacent layers when the three-point bending test is conducted.

In case the metal part 15 is bonded with the piezoelectric material layers 3 on both sides, stress is concentrated in the vicinity of a portion of the piezoelectric material layer 3 that is bonded with the metal part 15 at the instant when the metal part 15 fractures, which may result in cracks taking place in the piezoelectric material layer 3 or peel-off in the bonding interface between the piezoelectric material layer 3 and the metal part 15. In the multi-layer piezoelectric elements 1 of this embodiment, in contrast, the metal part 15 is bonded with the piezoelectric material layer 3 only on one side, and therefore peel-off is suppressed from occurring in the bonding interface between the piezoelectric material layer 3 and the metal part 15 while remaining bonded with the metal part 15. The performance can be evaluated by checking to see whether or not a part of the piezoelectric material layer 3 that has peeled off is bonded with the metal part 15 which is exposed in the fractured surface.

Figure 5:
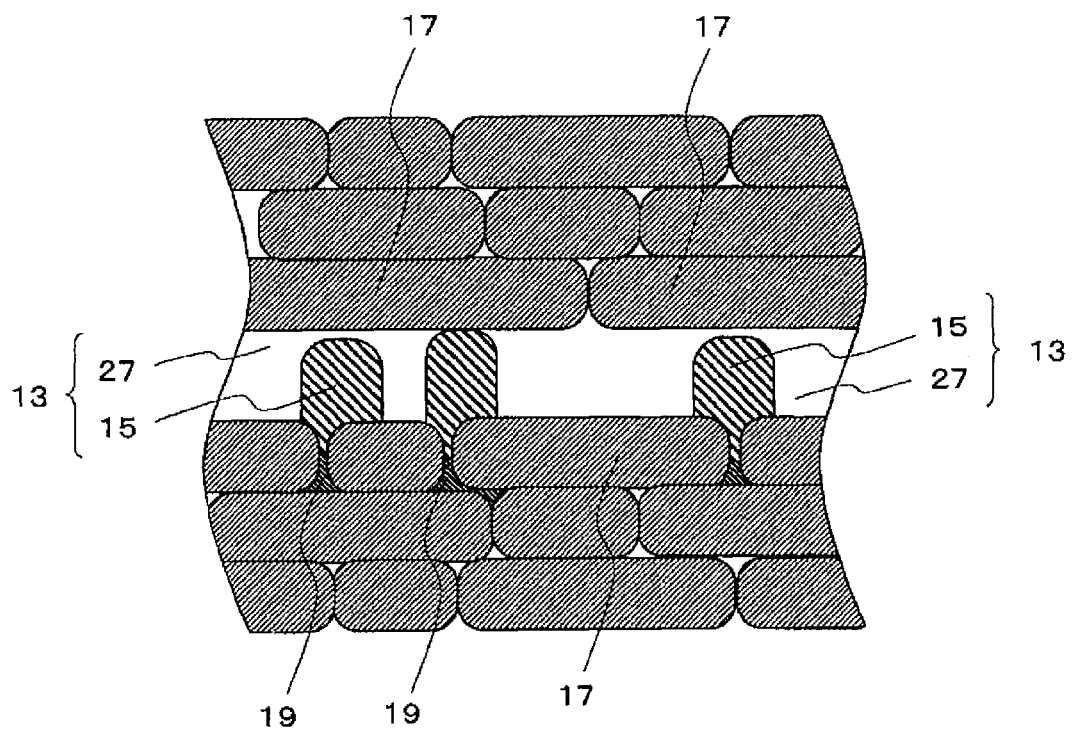
FIG. 5 is an enlarged sectional view showing the bonding between metal part and piezoelectric material layer according to the embodiment shown in FIG. 4.
Figure 6:
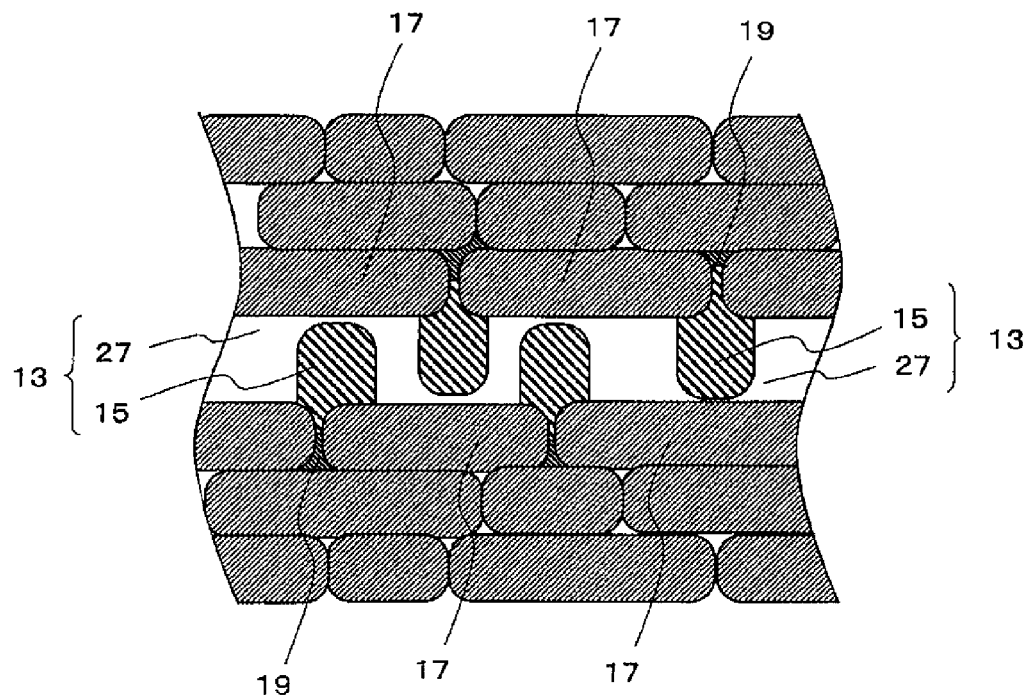
FIG. 6 is an enlarged sectional view showing another example of the embodiment of the first multi-layer piezoelectric element of the present invention.

FIG. 5 and FIG. 6 are enlarged sectional views showing another example of the embodiment of the multi-layer piezoelectric element according to the present invention. The phrase "one of the piezoelectric material layers 3" means one of the two piezoelectric material layers 3 that adjoin any of the metal parts 15 in the stacking direction. Accordingly, all of the metal parts 15 that are separated from each other via the voids 27 in one low-rigidity metal layer 13 may be bonded with only one (the lower piezoelectric material layer in the case shown in FIG. 5) of the two piezoelectric material layers 3 that adjoin in the stacking direction as shown in FIG. 5, or a plurality of the metal parts 15 that are separated from each other via the voids 27 in the low-rigidity metal layer 13 may be bonded with only one the different piezoelectric material layer 3 among the two piezoelectric material layers 3 that adjoin in the stacking direction as shown in FIG. 6.

In this embodiment, the metal parts 15 are formed mainly from a metal. Thus the metal parts 15 may either be constituted from metal component only, or contain ceramic or glass component.

As shown in FIG. 4 to FIG. 6, it is preferable that the metal parts 15 is separated from the other piezoelectric material layer 3 among the two piezoelectric material layers 3 that adjoin in the stacking direction. Thus durability of the piezoelectric material layer 3 can be improved by setting the metal parts 15 separated from the other piezoelectric material layer 3.

This is for the following reason. The multi-layer piezoelectric element 1 is used to repeat expansion and contraction by energizing repetitively. Therefore, when the metal part 15 is not separated from the other piezoelectric material layer 3 but in contact therewith, the metal parts 15 and the other piezoelectric material layer 3 hit each other repetitively when the multi-layer piezoelectric elements 1 is operated continuously. However, when the metal part 15 is separated from the other piezoelectric material layer 3, such a hitting action can be suppressed so that the piezoelectric material layer 3 can be suppressed from being damaged and durability can be improved.

It is preferable that the piezoelectric material layer 3 comprises a plurality of piezoelectric crystal grains 17, and one end of the metal part 15 is bonded with at least two piezoelectric crystal grains 17. This is because, as the piezoelectric material layer 3 comprises a plurality of piezoelectric crystal grains 17, the effect of dispersing the stress within the piezoelectric material layer 3 can be increased. It is also made possible to suppress concentration of stress in one piezoelectric crystal grain 17 which would make a starting point for new crack developing from the breakage of the piezoelectric crystal grain 17. Also when one end of the metal part 15 is bonded with at least two piezoelectric crystal grains 17, it is made possible to disperse the stress caused by the piezoelectric displacement of the piezoelectric material layer 3 to act on the metal part 15 over a wider region of the piezoelectric material layer 3.

It is preferable that one end of the metal part 15 infiltrates between the piezoelectric crystal grains 17 that adjoin each other. Forming the metal part 15 in this way increases the bonding strength between the metal part 15 and the piezoelectric material layer 3. In order to increase the bonding strength between the metal part 15 and the piezoelectric material layer 3, it is more preferable that one end of the metal part 15 has wedge shape.

Figure 7:
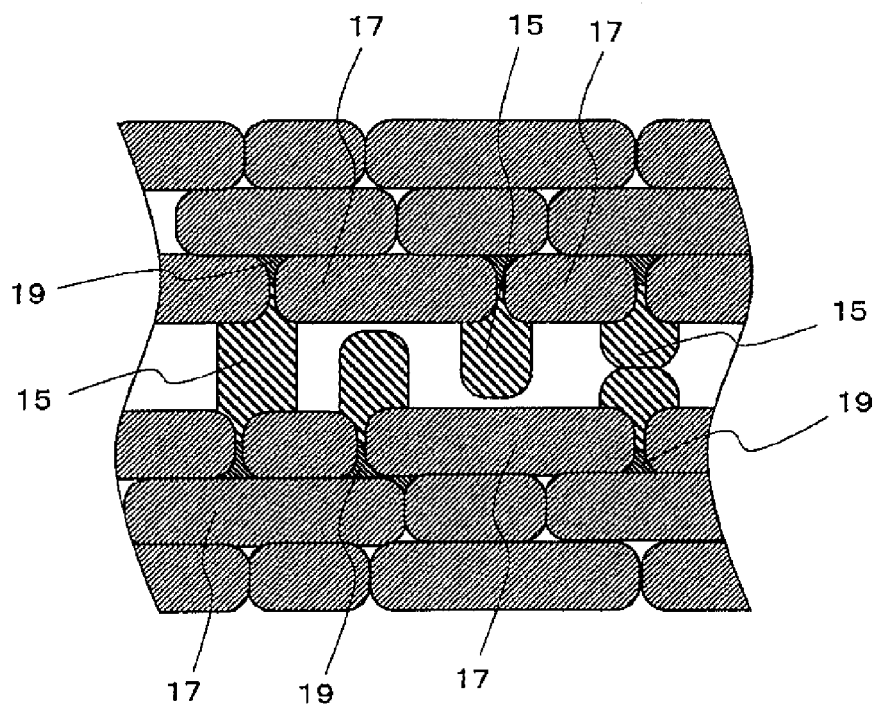
FIG. 7 is an enlarged sectional view showing another example of the embodiment of the first multi-layer piezoelectric element of the present invention.

FIG. 7 is an enlarged sectional view showing another example of the embodiment of the first multi-layer piezoelectric element according to the present invention. It is preferable that the piezoelectric material layer 3 further comprises a bonding material 19 that is disposed between the plurality of piezoelectric crystal grains 17 and bonds the adjacent piezoelectric crystal grains 17, and the metal part 15 is bonded with the bonding material 19, as shown in FIG. 5 to FIG. 7. This is because, as the metal part 15 is bonded with the piezoelectric crystal grains 17 via the bonding material 19, bonding strength between the metal part 15 and the piezoelectric material layer 3 can be increased. Also the bonding of the piezoelectric crystal grains 17 with each other by the bonding material 19 enables it to disperse the stress acting on the metal part 15 to even the piezoelectric crystal grains 17 disposed over a wider region of the piezoelectric material layer 3 that is not in contact with the metal part 15.

The bonding material 19 may be any material that can bond well with the metal parts 15 and the piezoelectric crystal grains 17, such as glass or an oxide of lead.

It is preferable that the bonding material 19 contains glass as a main component. This is because a glass component bonds well with the metal parts 15 and the piezoelectric material layer 3, and therefore using the bonding material 19 that contains glass as a main component improves the bonding between the bonding material 19 and the metal parts 15. Thus the metal parts 15 can be bonded more firmly with the piezoelectric material layer 3 on one side. The main component mentioned above means a component of the highest concentration in terms of weight percentage, among the components contained.

It is also preferable that the bonding material 19 contains the main component of the metal part 15. This is because inclusion of the main component of the metal part 15 causes the metal parts 15 and the main component of the metal part 15 contained in the bonding material 19 to bond with each other, thus generating anchoring effect. This further improves the bonding between the metal parts 15 and the bonding material 19.

It is further preferable that the bonding material 19 contains oxide of the main component of the metal part 15. This is because inclusion of oxide of the main component of the metal part 15 causes the metal parts 15 and the bonding material 19 to bond with each other by ionic bond that is stronger than metallic bond, thus further improving the bonding between the metal parts 15 and the bonding material 19.

The main component of the glass is preferably silicon oxide. This is because silicon oxide and the oxide of the main, component of the metal part 15 form a liquid phase when the multi-layer piezoelectric element is formed by firing, thereby accelerating the sintering process and improves affinity with the metal part 15 as well. This enables it to concentrate the bonding material 19 selectively in a surface region of the piezoelectric material layer 3 that makes contact with the metal part 15, as shown in FIG. 5 to FIG. 7.

Figure 8:
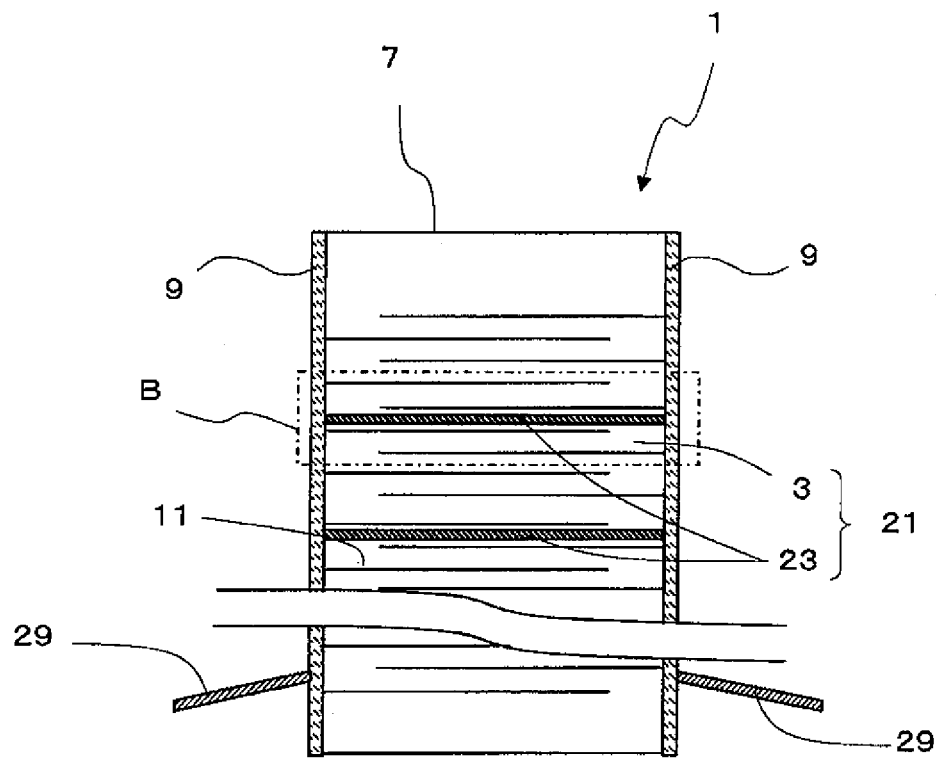
FIG. 8 is an enlarged sectional view along a direction parallel to the stacking direction showing an example of the embodiment of the second multi-layer piezoelectric element of the present invention.

The second multi-layer piezoelectric element of the present invention will be described in detail below with reference to the accompanying drawings. FIG. 8 is a sectional view showing one example of embodiment of the second multi-layer piezoelectric element according to the present invention, in a longitudinal sectional view along a direction parallel to the stacking direction.

As shown in FIG. 8, the multi-layer piezoelectric element 1 of this embodiment comprises a multi-layer structure 7 in which a plurality of ceramic layers 21 and a plurality of internal electrodes 11 are stacked alternately one on another, and external electrodes 9 formed on the side face of the multi-layer structure 7. The plurality of ceramic layers 21 comprises the piezoelectric material layers 3 and low-rigidity ceramic layer 23 that has rigidity lower than those of the piezoelectric material layer 3 and the internal electrode 11.

In this embodiment, the low-rigidity ceramic layer 23 means a layer that has lower bonding strength within the layer and/or the bonding strength with the adjacent layers and lower rigidity than those of the piezoelectric material layer 3 and the internal electrode 11, and comprises a plurality of ceramic parts 25 that are separated from each other. There are, for example, voids 27 between these ceramic parts 25. In another form, ceramics or a resin may exist instead of the voids 27 between these ceramic parts 25. Thus the low-rigidity ceramic layer 23 of the present invention represents such various forms.

When the multi-layer piezoelectric element 1 is subjected to a strong extraneous impact or stress during operation of the multi-layer piezoelectric element 1, stress can be absorbed by the low-rigidity ceramic layer 23. Therefore cracks are suppressed from occurring in the internal electrodes 11 and in the piezoelectric material layers 3, thereby suppressing short-circuiting from occurring between the internal electrodes 11 that adjoin each other in the stacking direction.

In the second multi-layer piezoelectric element of the present invention, the low-rigidity ceramic layer 23 comprises a plurality of ceramic parts 25 that are separated from each other, and at least one of the ceramic parts 25 is bonded with only one piezoelectric material layer 3 among the two piezoelectric material layers 3 that adjoin in the stacking direction. As a result, there is no force generated to constrain the two piezoelectric material layers 3 that adjoin the ceramic part 25, and therefore it is made possible to mitigate the stress generated by piezoelectric displacement.

Also it is made possible to reduce the possibility of crack generated in the low-rigidity ceramic layer 23 to grow into the piezoelectric material layers and more reliably mitigate the stress generated by piezoelectric displacement.

Comparison of rigidity among the low-rigidity ceramic layer 23, the piezoelectric material layer 3 and the internal electrode 11 can be easily done by, for example, applying a load to the element in a direction perpendicular to the stacking direction. Specifically, a load may be applied to the element 1 in a direction perpendicular to the stacking direction according to the procedure of JIS three-point bending test (JIS R 1601).

The multi-layer piezoelectric element 1 of this embodiment comprises the low-rigidity ceramic layer 23, and therefore fracture occurs preferentially in the low-rigidity ceramic layer 23 or in the vicinity of interface between the low-rigidity ceramic layer 23 and the piezoelectric material layer 3, rather than in the piezoelectric material layer 3 or in the internal electrode 11 when subjected to the JIS three-point bending test. Thus evaluation can be done by observing where fracture takes place, whether in the piezoelectric material layer 3 or in the internal electrode 11, or in the low-rigidity ceramic layer 23 or in the vicinity of interface between the low-rigidity ceramic layer 23 and the piezoelectric material layer 3.

Low rigidity means a low Young's modulus. Young's modulus may be measured, as described previously, by nano-indentation method.

Figure 9:
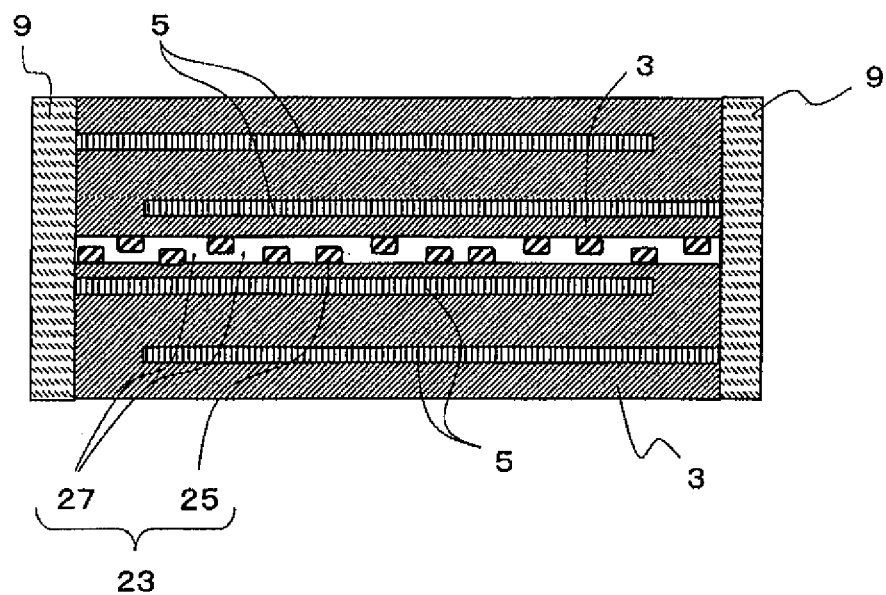
FIG. 9 is an enlarged sectional view of a region B according to the embodiment shown in FIG. 8.

FIG. 9 is an enlarged sectional view of a portion (region B) where the low-rigidity ceramic layer 23 is disposed in the multi-layer piezoelectric element 1 of the embodiment shown in FIG. 8. As shown in FIG. 9, the low-rigidity ceramic layer 23 comprises a plurality of ceramic parts 25 that are separated from each other via the voids 27. Since the low-rigidity ceramic layer 23 has such a constitution, bonding strength becomes lower within the low-rigidity ceramic layer 23 and/or bonding strength thereof with the adjacent piezoelectric material layer 3 becomes lower, and therefore rigidity of the low-rigidity ceramic layer 23 can be made lower.

In case every ceramic part 25 is bonded with the piezoelectric material layers 3 on both sides thereof, the piezoelectric material layers 3 that adjoin in the stacking direction are constrained by a greater force. Thus it becomes difficult for the ceramic grains that constitute the ceramic part 25 to individually deform. As a result, strong stress is generated between these grains. When the multi-layer piezoelectric element under this condition is subjected to stress by electrified, the strong stress acting on the ceramic part 25 propagates to the piezoelectric material layers 3.

This means that there is a possibility of stress to be concentrated in the vicinity of the interface between the piezoelectric material layer 3 and the ceramic part 25 at the instant that the ceramic part 25 fractures. Once a crack is generated in the ceramic part 25, the crack may grow into the piezoelectric material layer 3. The crack can reach each of the internal electrodes that adjoin in the stacking direction.

In the multi-layer piezoelectric element of this embodiment, in contrast, stress can be mitigated because a part of the ceramic part 25 is not bonded with the other piezoelectric material layer 3 as described above. This is because, when the element 1 is subjected to tensile stress, void is formed between the piezoelectric material layer 3 and the ceramic part 25 that is not bonded with this piezoelectric material layer 3, thereby releasing the stress in the void.

In case the element 1 is subjected to compressive stress, the stress can be suppressed from being concentrated in the vicinity of the interface between the piezoelectric material layer 3 and the ceramic part 25 since the ceramic part 25 is not bonded with the piezoelectric material layer 3 and is therefore not constrained by the piezoelectric material layer 3. This makes it possible to suppress the piezoelectric material layer 3 from breaking and the piezoelectric material layer 3 and the ceramic part 25 from peeling off in the bonding interface therebetween.

To sum up, when the ceramic part is bonded with only one piezoelectric material layer 3 and is not bonded with the other piezoelectric material layer 3 as in the present invention, stress can be suppressed from being concentrated in the vicinity of the interface between the piezoelectric material layer 3 and the ceramic part 25. As a result, even when a crack is generated in the ceramic part 25, propagation of the crack into the piezoelectric material layer 3 can be suppressed. Thus it is made possible to suppress such a crack from being generated in the piezoelectric material layer 3, that reaches each of the internal electrodes 11 that adjoin in the stacking direction. Also because the plurality of ceramic parts 25 is separated from each other, cracks are suppressed from growing in unexpected directions.

In the low-rigidity ceramic layer 23, since the piezoelectric material layer 3 is bonded only partially by the ceramic parts 25 that are separated from each other (scattered) via the voids 27, the piezoelectric material layer 3 that makes contact with the low-rigidity ceramic layer 23 can deform relatively freely.

As a result, when the multi-layer piezoelectric element 1 is subjected to a stress, the stress is absorbed as the piezoelectric material layer 3 that makes contact with the low-rigidity ceramic layer 23 deforms due to the stress. In the portion of the piezoelectric material layer 3 that makes contact with the ceramic parts 25, the piezoelectric material layer 3 is suppressed from deforming. Therefore, tensile or compressive strain is generated in the ceramic parts 25 and in part of the piezoelectric material layer 3 that makes contact with the ceramic parts 25, although the strain is transformed into thermal energy and is dispersed. Thus the low-rigidity ceramic layer 23 including the ceramic parts 25 dispersed therein mitigates the stress generated in the multi-layer piezoelectric element 1.

Since the plurality of ceramic parts 25 is separated from each other in the low-rigidity ceramic layer 23, cracks are suppressed from growing beyond the low-rigidity ceramic layer 23 and it is made possible to suppress the cracks from growing in unexpected directions.

It is preferable that the ceramic parts 25 are formed evenly over the entire surface of the low-rigidity ceramic layer 23, when the low-rigidity ceramic layer 23 is viewed in the stacking direction. This is because forming the low-rigidity ceramic layer 23 in this way improves the effect of relieving the multi-layer piezoelectric element 1 of the stress in various directions. This makes it possible to more reliably reduce the possibility of such a crack to be generated that reaches the internal electrodes 11 of both polarities that adjoin in the stacking direction. As a result, it is made possible to provide the multi-layer piezoelectric element 1 that operates stably with high reliability.

It can be determined whether the ceramic part 25 is bonded with the piezoelectric material layers 3 on one side and the other side thereof or not, by conducting the JIS three-point bending test described previously, or a three-point bending test based on the JIS three-point bending test, and observing the fracture surface. In the multi-layer piezoelectric element 1 of this embodiment, since the low-rigidity ceramic layer 23 is lower in rigidity than the piezoelectric material layer 3 and the internal electrodes 11, fracture occurs within the low-rigidity ceramic layer 23 and/or in the vicinity of interface thereof with the adjoining piezoelectric material layers 3 when the three-point bending test is conducted.

In case the ceramic part 25 is bonded with the piezoelectric material layers 3 on both sides thereof, when the multi-layer piezoelectric element 1 is fractured by the test described above, crack or fracture occurs within the ceramic part 25 or in the vicinity of interface where the piezoelectric material layer 3 is bonded with the ceramic part 25. As a result, two fracture surfaces of the multi-layer piezoelectric element 1 show breakage of the piezoelectric material layer 3 and the ceramic part 25 having the same shape.

In case the piezoelectric material layer 3 and the ceramic part 25 are constituted from a plurality of grains, in particular, crack or fracture that occurs in the ceramic part 25 or in the vicinity of interface where the piezoelectric material layer 3 is bonded with the ceramic part 25 may be generated within the crystal grains as well as between the grains. Therefore, in Case the ceramic part 25 is bonded with the piezoelectric material layers 3 on both sides, faces of breakage of the piezoelectric material layer 3 and the ceramic part 25 that have the same shape and the same crystal orientation appear on the fracture surfaces.

In the multi-layer piezoelectric element 1 of this embodiment, in contrast, since the ceramic part 25 is bonded with only one of the piezoelectric material layers 3, the breakage described above does not occur and faces of breakage of the piezoelectric material layer 3 and the ceramic part 25 that have the same shape do not appear on the fracture surfaces. Thus evaluation can be made by checking to see whether faces of breakage of the same shape are exposed on the fracture surfaces or not.

The phrase "one of the piezoelectric material layers 3" means one of the two piezoelectric material layers 3 that adjoin any of the ceramic parts 25 in the stacking direction. Accordingly, all of the ceramic parts 25 included in one low-rigidity ceramic layer 23 may be bonded with only one of the two piezoelectric material layers 3 that adjoin in the stacking direction.

Figure 10:
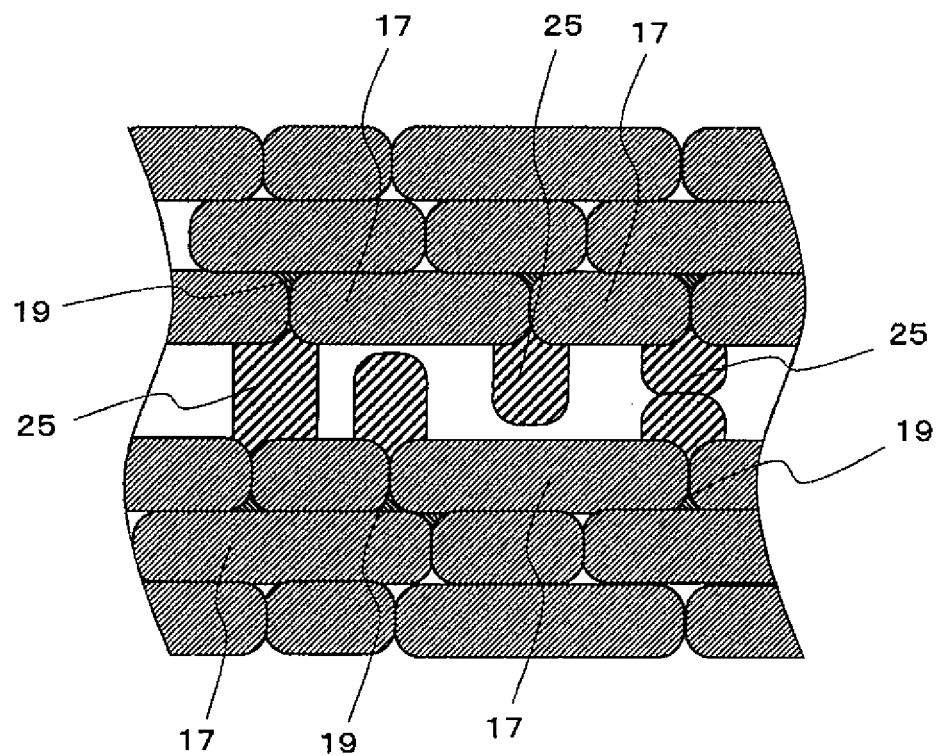
FIG. 10 is an enlarged sectional view showing another example of the embodiment of the second multi-layer piezoelectric element of the present invention.

FIG. 10 is an enlarged sectional views showing another example of the embodiment of the second multi-layer piezoelectric element according to the present invention. As shown in FIG. 10, a plurality of the ceramic parts 25 included in the low-rigidity ceramic layer 23 may be bonded with only the different piezoelectric material layer 3 among the two piezoelectric material layers 3 that adjoin in the stacking direction.

It is preferable that the ceramic part 25 is separated from the other piezoelectric material layer 3 among the two piezoelectric material layers 3 that adjoin in the stacking direction. This is because durability of the piezoelectric material layer 3 can be improved for the same reason as that for the first multi-layer piezoelectric element of the present invention, by disposing the ceramic parts 25 to be separated from the other piezoelectric material layer 3.

It is preferable that the low-rigidity ceramic layer 23 and the ceramic part 25 are formed from piezoelectric material. This is because these components formed from piezoelectric material undergo piezoelectric displacement when the element 1 is electrified and therefore the amount of displacement can be increased.

It is preferable that the low-rigidity ceramic layer 23 and the ceramic part 25 are constituted from the same components as those of the piezoelectric material layer 3. Forming the low-rigidity ceramic layer 23 and the ceramic part 25 from the same components as those of the piezoelectric material layer 3 improves the bonding strength between the piezoelectric material layer 3 and the ceramic part 25.

The method for manufacturing the multi-layer piezoelectric element 1 of the present invention will be described below.

First, ceramic green sheets (hereinafter referred to simply as sheet) that would become the piezoelectric material layers 3 are formed. Specifically, a calcined powder of a piezoelectric ceramic material, a binder made of an organic polymer such as an acrylic or butyral resin and a plasticizer are mixed to form a slurry. The slurry is formed into sheets by a known method such as a doctor blade or calender roll method, or other tape molding method. The piezoelectric ceramic material is required only to have piezoelectric characteristics, and perovskite type oxide such as $PbZrO_3$—$PbTiO_3$ may be used. For the plasticizer, DBP (dibutyl phthalate) or DOP (dioctyl phthalate) or the like may be used.

While the piezoelectric material layers 3 can be formed by firing the sheets described above, in order to form the low-rigidity metal layer 23 including the ceramic parts 25 that are separated from each other, an evaporative component such as acrylic beads or carbon as the binder or the resin may be mixed in the sheets. The ceramic parts 25 that are separated from each other can be formed as the evaporative component evaporates in the processes of firing and degreasing.

Then an electrically conductive paste used to form the internal electrodes 11 is prepared. Specifically, a metal powder such as silver-palladium is mixed with such additive as a binder and a plasticizer to prepare the electrically conductive paste. The electrically conductive paste is applied over the entire surface of the ceramic green sheet by screen printing process, and is fired to form the metal layer 5 as will be described later.

While the internal electrodes 11 can be formed by firing the electrically conductive paste described above, the low-rigidity metal layer 13 comprising the metal parts 15 that are separated from each other may be formed by mixing an evaporative component such as acrylic beads or carbon in the binder or the resin contained in the electrically conductive paste. The metal parts 15 that are separated from each other can be formed by applying the electrically conductive paste having the evaporative component mixed therein onto the sheet by screen printing process, as the evaporative component evaporates in the processes of firing and degreasing.

The methods of forming the metal parts 15 and the ceramic parts 25 that are separated from each other are not limited to those described above. For example, the metal parts 15 and the ceramic parts 25 can be formed by changing the mesh size of the screen or the pattern configuration. Specifically, if mesh size of the screen is set to 15 μm or less, the amount of ink paste that passes the screen decreases to cause a blurred pattern, so that the metal parts 15 and the ceramic parts 25 that are separated from each other can be formed. The metal parts 15 and the ceramic parts 25 that are separated from each other can also be formed by masking the screen to prevent the ink paste from passing the screen, similarly. The masking configuration is preferably near round shape such as oval or circle, which has the effect of mitigating the stress.

In the embodiment of the first multi-layer piezoelectric element of the present invention, the metal part 15 that is bonded with only one of the two piezoelectric material layers 3 that adjoin in the stacking direction as shown in FIG. 5 can be formed, by mixing the bonding material 19 in one of the two ceramic green sheets that would become the two piezoelectric material layers 3 that adjoin the low-rigidity metal layer 13 in the stacking direction.

The metal part 15, that is bonded with only one piezoelectric material layer 3 among the two piezoelectric material layers 3 that adjoin in the stacking direction, can be formed by a process described below, instead of the process described above. That is, when applying the electrically conductive paste that would make the low-rigidity metal layer 13 and stacking the electrically conductive paste and the ceramic green sheets that would become the piezoelectric material layers 3 that adjoin the low-rigidity metal layer 13 in the stacking direction, a paste that contains the bonding material 19 is applied between one of the ceramic green sheets and the electrically conductive paste. Stacking one of the ceramic green sheets on the electrically conductive paste via the paste that contains the bonding material 19 enables it to form the metal part 15 that is bonded with only one piezoelectric material layer 3 among the two piezoelectric material layers 3 that adjoin in the stacking direction.

Alternatively, with a component that lowers the wettability with the low-rigidity metal layer 13 mixed in the other one of the two green sheets that would become the two piezoelectric material layers 3 that adjoin the low-rigidity metal layer 13 in the stacking direction, the metal part 15 can also be formed so as to be bonded with only one piezoelectric material layer 3 among the two piezoelectric material layers 3 that adjoin in the stacking direction as shown in FIG. 5. BN or carbon may be used as the component that lowers the wettability with the low-rigidity metal layer 13.

Alternatively, the metal part 15 that is bonded with only one piezoelectric material layer 3 among the two piezoelectric material layers 3 that adjoin in the stacking direction can be formed also by applying a paste that contains a component, which lowers the wettability with the low-rigidity metal layer 13, between the other sheet and the electrically conductive paste when stacking the electrically conductive paste that would become the low-rigidity metal layer 13 and the sheets that would become the piezoelectric material layers 3 that adjoin the low-rigidity metal layer 13 in the stacking direction.

Whether a material that lowers the wettability with the low-rigidity metal layer 13 such as BN has been used or not can be determined by carrying out the following measurement.

First, samples are taken from the two piezoelectric material layers 3, for example by cutting the multi-layer structure 7 so as to expose the two piezoelectric material layers 3 that adjoin the low-rigidity metal layer 13. Composition of the piezoelectric material layers 3 is determined through chemical analysis such as ICP (induction-coupled plasma) fluorescence analysis, so as to determine the concentration of the component that lowers the wettability in the piezoelectric material layers 3. In case the component that lowers the wettability with the low-rigidity metal layer 13 is mixed in the other sheet among the ceramic green sheets that would become the two piezoelectric material layers 3 that adjoin the low-rigidity metal layer 13 in the stacking direction as in the case of this embodiment, there exists a difference in the concentration of the component that lowers the wettability between the two piezoelectric material layers 3. The same applies also to a case where a paste that contains a component that lowers the wettability with the low-rigidity metal layer 13 is applied between the other sheet and the electrically conductive paste.

Instead of chemical analysis such as induction-coupled plasma (ICA) fluorescence analysis, cut surface of the multi-layer piezoelectric element 1 may be analyzed by other analysis method such as electron probe microanalysis (EPMA).

Mixing the bonding material 19 in each of the two ceramic green sheets that would become the two piezoelectric material layers 3 that adjoin the low-rigidity metal layer 13 in the stacking direction results in the formation of the metal parts 15 each being bonded with only one of the two piezoelectric material layers 3 that adjoin in the stacking direction, as shown in FIG. 6.

When the internal electrodes 11 are formed from silver-palladium alloy, the low-rigidity metal layer 13 comprising the plurality of metal parts 15 which are separated from each other can be formed without complicated processes, by using the electrically conductive paste, that has a silver content in the silver-palladium alloy higher than that of the electrically conductive paste used to form the internal electrode 11, to form the low-rigidity metal layer 13.

This is because, when the multi-layer structure 7 is formed by placing the electrically conductive paste having higher silver content at a position where the low-rigidity metal layer 13 is to be formed and fired at the same time, silver diffuses out of the electrically conductive paste that has higher silver content into the electrically conductive paste that has lower silver content. As the silver diffuses, a plurality of metal parts 15 that are separated from each other is formed, so that the electrically conductive paste having higher silver content forms the low-rigidity metal layer 13 that has lower rigidity than those of the internal electrodes 11 and the piezoelectric material layer 3.

By mixing the bonding material 19 in the electrically conductive paste used to form the low-rigidity metal layer 13, it is made possible to efficiently bond the metal part 15 with the piezoelectric material layer 3 via the bonding material 19. This is because the bonding material 19 mixed in the electrically conductive paste diffuses along with silver. As previously mentioned, when the electrically conductive paste, that has higher silver content in the silver-palladium alloy than that of the electrically conductive paste used to form the internal electrode 11, is used to form the low-rigidity metal layer 13, silver diffuses out of the electrically conductive paste of higher silver content. As the silver diffuses, the bonding material 19 diffuses accordingly.

The bonding material 19 has higher tendency to bond with the piezoelectric crystal grains 17 than silver, and therefore bonds with the piezoelectric crystal grains 17 while diffusing. Then the bonding material 19 that has bonded with the piezoelectric crystal grains 17 bonds with the diffusing silver, so that the metal part 15 and the piezoelectric material layer 3 are bonded together via the bonding material 19.

When the metal part 15 and the piezoelectric material layer 3 are bonded together via the bonding material 19, silver and the bonding material 19 diffuse between the piezoelectric crystal grains 17, and therefore there is a high tendency that the end of the metal part 15 is formed in a configuration of infiltrating between the adjoining piezoelectric crystal grains 17. As a result, one end of the metal part 15 is wedge-shaped, thereby making the bonding between one end of the metal part 15 and the piezoelectric material layer 3 firmer.

It is preferable that part of the metal parts 15 is bonded via the bonding material 19 with both of the two piezoelectric material layers 3 that adjoin in the stacking direction as shown in FIG. 7. When the metal parts 15 are formed in this way, the two piezoelectric material layers 3 that adjoin in the stacking direction are connected via the metal parts 15 so that the shape of the multi-layer piezoelectric elements 1 can be maintained stably while keeping the high stress relieving effect.

The electrically conductive paste that would form the low-rigidity metal layer 13 is applied to a thickness of 1 to 40 µm on the top surface of the ceramic green sheet by screen printing process or the like. A plurality of ceramic green sheets having the electrically conductive paste printed thereon is stacked one on another, and are fired at a temperature from 200 to 800° C. so as to remove the binder. At this time, in order to leave the voids 27 remain effectively between the metal parts 15, it is preferable to fire for degreasing at a temperature higher than the glass transition temperature (Tg point) of the evaporative component.

After degreasing, the stack is fired at a temperature from 900 to 1,200° C. so as to form the multi-layer structure 7. Setting the firing temperature to 900° C. or higher enables it to sinter the piezoelectric material layer 3 sufficiently, thus suppressing the displacement characteristic from being influenced. On the other hand, setting the firing temperature to 1,200° C. or lower results in the suppression of melting or decomposition of the low-rigidity metal layer 13, and therefore enables it to maintain the shape of the low-rigidity metal layer 13. When firing, it is preferable to maintain the temperature higher than the Tg point of the evaporative component, in order to leave the voids 27 remain effectively between the metal parts 15.

Method for manufacturing the multi-layer structure 7 is not limited to that described above. Any method may be employed as long as the multi-layer structure 7 can be manufactured in such a constitution as a plurality of piezoelectric material layers 3 and a plurality of metal layers 5 are stacked alternately one on another.

The low-rigidity ceramic layer 23 may be formed, besides the use of a material having lower rigidity than that of the piezoelectric material layers 3, by forming a ceramic sheet having acrylic beads about 1 µm in particle size and a ceramic powder added thereto, stacking the sheets and firing, for the embodiment of the second multi-layer piezoelectric element of the present invention.

The ceramic part 25 bonded with only one of the two piezoelectric material layers 3 that adjoin in the stacking direction can be formed by mixing the bonding material 19 in only one of two ceramic green sheets that would become the two piezoelectric material layers 3 that adjoin the low-rigidity ceramic layer 23 in the stacking direction, as shown in FIG. 8 to FIG. 10.

The ceramic part 25 bonded with only one of the two piezoelectric material layers 3 that adjoin in the stacking direction can also be formed, besides the method described above, by the following process. When stacking the sheet that would become the low-rigidity ceramic layer 23 and the sheets that would become the two piezoelectric material layers 3 that adjoin the low-rigidity ceramic layer 23 in the stacking direction, a paste that contains the bonding material 19 is placed between one of the piezoelectric material layers 3 and the low-rigidity ceramic layer 23.

As one of the piezoelectric material layers 3 is stacked on the low-rigidity ceramic layer 23 via the paste that contains the bonding material 19, the ceramic part 25 bonded with only one of the two piezoelectric material layers 3 that adjoin in the stacking direction can be formed.

The ceramic part 25 bonded with only one of the two piezoelectric material layers 3 that adjoin in the stacking direction can be formed also by mixing a component that decreases the strength of bonding with the other low-rigidity ceramic layer 23 in the other sheet among the two sheets that would become the two piezoelectric material layers 3 that adjoin the low-rigidity ceramic layer 23 in the stacking direction. For the material that decreases the strength of bonding with the low-rigidity ceramic layer 23, BN, carbon or the like may be used.

Alternatively, the ceramic part 25 bonded with only one of the two piezoelectric material layers 3 that adjoin in the stacking direction can be formed by placing a paste that includes a component that lowers the strength of bonding with the low-rigidity ceramic layer 23 between the other piezoelectric material layer 3 and the low-rigidity ceramic layer 23, when stacking the sheet that would become the low-rigidity ceramic layer 23 and the sheets that would become the two piezoelectric material layers 3 that adjoin with the low-rigidity ceramic layer 23 in the stacking direction.

Also each of the ceramic parts 25 can be formed so as to be bonded with only one of the two piezoelectric material layers 3 that adjoin in the stacking direction as shown in FIG. 10, by mixing the bonding material 19 in each of the two sheets that would become the two piezoelectric material layers 3 that adjoin the low-rigidity ceramic layer 23 in the stacking direction.

It is preferable that part of the ceramic parts 25 is bonded via the bonding material 19 with both of the two piezoelectric material layers 3 that adjoin in the stacking direction as shown in FIG. 10. When the ceramic parts 25 are formed in this way, the two piezoelectric material layers 3 that adjoin in the stacking direction are connected via the ceramic parts 25, and therefore the shape of the multi-layer piezoelectric elements 1 can be maintained stably.

A plurality of sheets that would become the piezoelectric material layers 3, the electrically conductive paste that would become the internal electrodes 11 and the sheets that would become the low-rigidity ceramic layer 23 are stacked one on another, and are fired at a temperature from 200 to 800° C. so as to remove the binder. At this time, in order to leave the voids 27 remain effectively between the ceramic parts 25, it is preferable to fire for degreasing at a temperature higher than the Tg point of the evaporative component.

After degreasing, the stack is fired at a temperature from 900 to 1,200° C. so as to form the multi-layer structure 7. Setting the firing temperature to 900° C. or higher enables it to sinter the piezoelectric material layer 3 sufficiently, thus suppressing the displacement characteristic from being influenced. When firing, it is preferable to maintain the temperature higher than the Tg point of the evaporative component, in order to leave the voids 27 remain effectively between the ceramic parts 25.

Method for manufacturing the multi-layer structure 7 is not limited to that described above. Any method may be employed as long as the multi-layer structure 7 can be manufactured in such a constitution as a plurality of ceramic layers 21 and a plurality of internal electrode 11 are stacked alternately one on another.

The low-rigidity ceramic layer 23 can be formed, instead of using a material that has rigidity lower than that of the piezoelectric material layers 3 or stacking and firing the ceramic sheets formed by adding acrylic beads as described previously, also by employing a common manufacturing method such as screen printing with mesh as will be described later.

Then the external electrodes 9 are formed so as to establish electrical connection with the internal electrodes 11 of which ends are exposed on the side faces of the multi-layer piezoelectric element 1. The external electrodes 9 can be formed by adding a binder to a glass powder to prepare a silver-glass electrically conductive paste, printing the electrically conductive paste and firing.

Then the multi-layer structure 7 whereon the external electrodes 9 are formed is dipped in a resin solution that contains a silicone rubber. The silicone resin solution is deaerated in vacuum thereby having the external surface of the multi-layer structure 7 covered by the silicone resin. The multi-layer structure 7 is then pulled up from the silicone resin solution, with the side faces of the multi-layer structure 7 coated with the silicone resin (not shown). Then lead wires are connected as power supply section 29 by means of an electrically conductive adhesive (not shown) or the like onto the external electrodes 9.

Then DC electric voltage is applied in a range from 0.1 to 3 kV/mm across a pair of external electrodes 9 via the lead wires so as to carry out polarization treatment of the multi-layer structure 7, thereby to complete the multi-layer piezoelectric element 1 of this embodiment. When the lead wires are connected to an external power supply (not shown) and a voltage is applied to the internal electrodes 11 via the lead wires serving as the power supply section 29 and through the external electrodes 9, the piezoelectric material layers 3 can undergo a large displacement by the reverse piezoelectric effect. Thus the element is capable of functioning as an automobile fuel ejection valve that supplies fuel to an engine.

An electrical conductivity assisting member (not shown), formed from a metal mesh or a mesh-like metal sheet may be embedded in the electrically conductive adhesive. Embedding the electrical conductivity assisting member in the electrically conductive adhesive makes it possible, to supply a large current flowing through the electrical conductivity assisting member so as to suppress an excessive current from flowing in the external electrodes 9 even when the element is operated at a high speed. As a result, local heating which may lead to breakage of the external electrode 9 can be effectively prevented from occurring, thereby significantly improving the durability.

When the metal mesh or mesh-like metal sheet is embedded in the electrically conductive adhesive, possibility of cracks occurring in the electrically conductive adhesive can be decreased. The metal mesh may be a structure of entwined metal wires, and the mesh-like metal sheet may be a metal sheet with a number of holes punched therethrough.

An ejection apparatus 31 according to one embodiment of the present invention will be described below.

Figure 11:
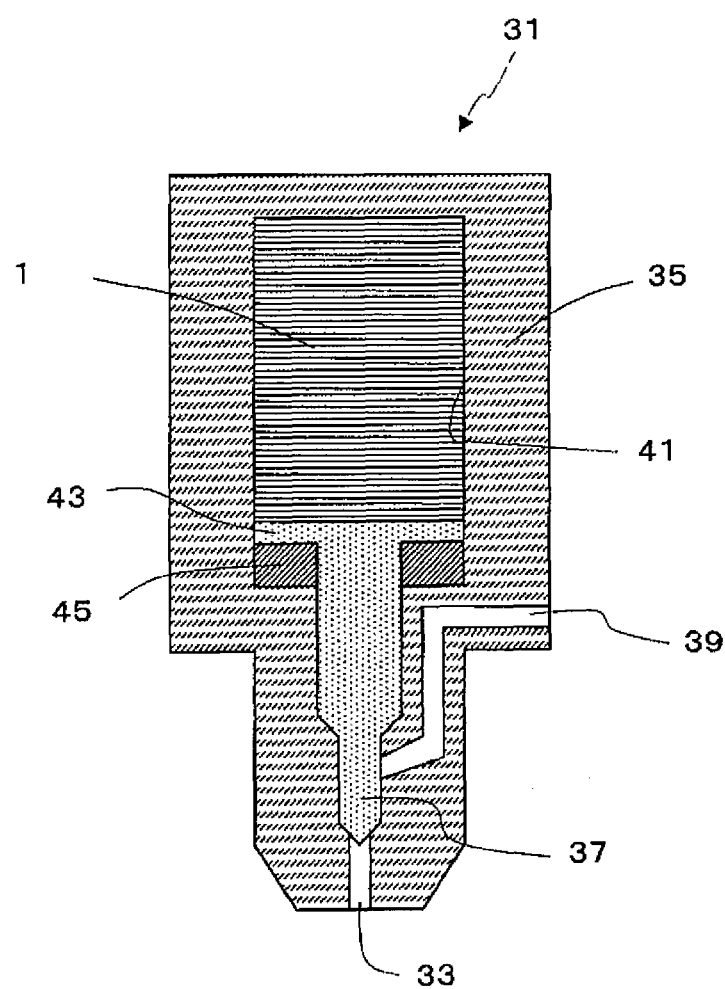
FIG. 11 is a sectional view showing an ejection apparatus of the present invention.

FIG. 11 is a schematic sectional view of the ejection apparatus 31 according one embodiment of the present invention. As shown in FIG. 11, the ejection apparatus 31 of this embodiment comprises the multi-layer piezoelectric element 1 represented by the embodiment described above housed in a housing 35 comprising an ejection hole 33 formed at one end thereof. The housing 35 includes a needle valve 37 that can open or close the ejection hole 33 disposed therein. Connected to the ejection hole 33 is a fuel passage 39 that is capable of communicating therewith in response to the action of the needle valve 37. The fuel passage 39 is connected to a fuel source provided outside, so that a fuel is supplied through the fuel passage 39 at a constant pressure that is always high. Accordingly, when the needle valve 37 opens the ejection hole 33, the fuel supplied to the fuel passage 39 is ejected at a high constant pressure into a fuel chamber of an internal combustion engine which is not shown.

The needle valve 37 has an upper end where the inner diameter is made larger and a piston 43 is disposed so as to be capable of sliding in a cylinder 41 formed in the housing 35. The multi-layer piezoelectric element 1 described above is housed in the housing 35.

With the ejection apparatus 31 as described above, when the multi-layer piezoelectric element 1 is caused to expand by applying a voltage thereto, the piston 43 is pressed so that the needle valve 37 plugs the ejection hole 33 and shuts off the fuel supply. When the voltage is removed, the multi-layer piezoelectric element 1 contracts and a Belleville spring 45 presses back the piston 43 so that the ejection hole 33 communicates with the fuel passage 39 thereby allowing the fuel to be ejected.

The ejection apparatus 31 of this embodiment may also be constituted from the housing comprising the ejection hole 33 and the multi-layer piezoelectric element 1, so that the liquid that fills the housing is discharged through the ejection hole 33 by the operation of the multi-layer piezoelectric element 1. That is, the multi-layer piezoelectric element 1 may not necessarily be in the inside of the housing. The only requirement is that pressure can be applied to the inside of the housing by the operation of the multi-layer piezoelectric element 1. In this embodiment, the liquid may be a fuel, ink or various other fluid such as electrically conductive paste.

A fuel ejection system according to one embodiment of the present invention will be described below.

Figure 12:
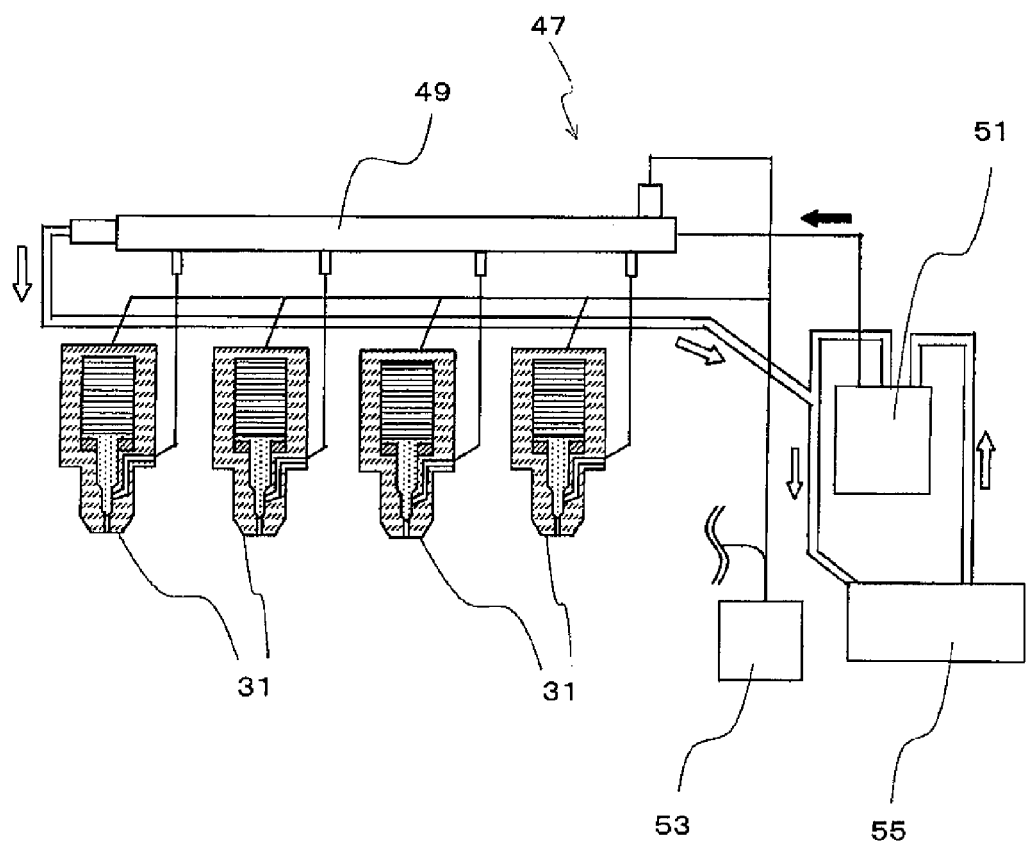
FIG. 12 is a schematic diagram showing a fuel ejection system according to one embodiment of the present invention.

FIG. 12 is a schematic diagram showing the fuel ejection system 47 according to one embodiment of the present invention. As shown in FIG. 12, the fuel ejection system 47 of this embodiment comprises a common rail 49 that stores a high-pressure fuel, a plurality of the ejection apparatuses 31 that eject the fuel stored in the common rail 49, a pump 51 that supplies the high-pressure fuel to the common rail 49 and an ejection control unit 53 that supplies a drive signal to the ejection apparatuses 31.

The ejection control unit 53 controls the quantity and timing of fuel ejection while monitoring the condition in the combustion chamber of an engine with sensors and the like. The pump 51 delivers the fuel from the fuel tank 55 to the common rail 49 by boosting the pressure to a level in a range from 1,000 to 2,000 atm, and preferably from 1,500 to 1,700 atm. The common rail 49 stores the fuel supplied from the pump 51, and sends it to the ejection apparatuses 31 as required. The ejection apparatus 31 ejects a small amount of the fuel through the ejection hole 33 in the form of mist into the combustion chamber.

The present invention relates to the multi-layer piezoelectric element 1, the ejection apparatus 31 and the fuel ejection system 47, although the present invention is not limited to the embodiment described above. The present invention can be applied to various applications as, for example, drive element used in a fuel ejection apparatus of automobile engine, liquid ejection apparatus of ink jet printer, precision positioning device for an optical apparatus, vibration preventing device or the like, sensor element mounted in combustion pressure sensor, knocking sensor, acceleration sensor, load sensor, ultrasound sensor, pressure sensor, yaw rate sensor or the like, and circuit component mounted in piezoelectric gyro, piezoelectric switch, piezoelectric transducer, piezoelectric breaker or the like, and any other devices that utilize piezoelectric characteristics.

The present invention is not limited to the embodiment described above, and various modifications may be made within the scope of the present invention.

EXAMPLES

The multi-layer piezoelectric element 1 of the present invention was fabricated as described below.

First, a material powder constituted from lead titanate zirconate (PZT) having a mean particle diameter of 0.4 μm as the main component, a binder and a plasticizer were mixed to form a slurry which was formed into ceramic green sheets A having a thickness of about 150 μm by the doctor blade process. Ceramic green sheets B having thickness of about 150 μm were also formed by mixing tetraethoxysilane (TEOS) in a slurry so that 0.01 wt % of $SiO_2$ was contained in the PZT powder as the bonding material 19.

Then an electrically conductive paste A was prepared by adding a binder to a material powder that contained a silver alloy powder of composition Ag 95 wt %-Pd 5 wt %. An electrically conductive paste B was also prepared by adding a binder to a material powder that contained a silver alloy powder of composition Ag 98 wt %-Pd 2 wt %. In addition, an electrically conductive paste C was prepared by adding tetraethoxysilane (TEOS) and a binder to a material powder that contained a silver alloy powder of composition Ag 98 wt %-Pd 2 wt % so that 0.01 wt % of $SiO_2$ was contained in the silver alloy powder as the bonding material 19.

In example No. 1, the electrically conductive paste A was printed with a thickness of 30 μm by screen printing to one side of the sheet A. The sheets A having the electrically conductive paste A printed thereon were stacked to form the multi-layer structure 7. 300 metal layers 5 were stacked, and 20 ceramic green sheets A without electrically conductive paste printed thereon were stacked on both ends in the stacking direction of the multi-layer structure 7.

In example No. 2, the electrically conductive paste A was printed with a thickness of 30 μm by the screen printing process to one side of the sheet A. The electrically conductive paste B was printed with a thickness of 30 μm by screen printing to one side of the sheet B. The multi-layer structure 7 was made by stacking the sheets A having the electrically conductive paste A printed thereon and the sheets B having the electrically conductive paste B printed thereon, so that the electrically conductive paste B printed on the sheets B would be located at five positions of the $50^{th}$, $100^{th}$, $150^{th}$, $200^{th}$ and $250^{th}$ metal layers 5 in the stacking direction. Similarly to example No. 1, 300 metal layers 5 were stacked, and 20 ceramic green sheets A without electrically conductive paste printed thereon were stacked on both ends in the stacking direction of the multi-layer structure 7.

In example No. 3, the multi-layer structure 7 was made similarly to example No. 2. However, In contrast to example No. 2 where only one side of the electrically conductive paste B in the stacking direction adjoins the sheet B, the electrically conductive paste B is interposed between the sheets B in example No. 3.

In example No. 4, the electrically conductive paste A was printed with a thickness of 30 μm by the screen printing process to one side of the sheet A. The electrically conductive paste C was printed with a thickness of 30 μm by the screen printing process to one side of another sheet A. The multi-layer structure 7 was made by stacking the sheets A having the electrically conductive paste A printed thereon and the sheets A having the electrically conductive paste C printed thereon, so that the electrically conductive paste C would be located on the $50^{th}$, $100^{th}$, $150^{th}$, $200^{th}$ and $250^{th}$ metal layers 5 in the stacking direction. Similarly to example No. 1, 300 metal layers 5 were stacked, and 20 ceramic green sheets A without electrically conductive paste printed thereon were stacked on both ends in the stacking direction of the multi-layer structure 7.

After firing the multi-layer structure 7 of each example at a predetermined temperature so as to remove the binder, the stack was fired at a temperature from 800 to 1,200° C. so as to obtain a sintered body. The electrically conductive paste A and the electrically conductive paste B having different silver contents were used in the multi-layer structure 7 of the examples No. 2 and No. 3, and the electrically conductive paste A and the electrically conductive paste C having different silver contents were used in the multi-layer structure 7 of the example No. 4. As a result, silver diffused from the electrically conductive paste B or the electrically conductive paste C of higher silver concentration to the electrically conductive paste A of lower silver concentration. This caused the low-rigidity metal layer 13 having high void ratio of 80% to be formed as shown in Table 1.

Then the external electrodes 9 were formed after machining the sintered bodies to the desired dimensions. First, the electrically conductive paste to form the external electrode 9 was prepared by mixing a binder, a plasticizer, a glass powder and the like to a metal powder constituted mainly from silver. The external electrodes 9 were formed by printing the electrically conductive paste by screen printing or the like at positions on the side faces of the sintered body where the external electrodes 9 were to be formed and firing at a temperature from 600 to 800° C. Thus the multi-layer piezoelectric element 1 was manufactured.

Two multi-layer piezoelectric elements 1 were made for each example. This was for the purpose of evaluation, one to be observed under a scanning electron microscope (SEM) and one for operation test. Composition of the electrically conductive paste used to make the multi-layer piezoelectric element 1 for each example, void ratio of the metal layer 5 after firing and shape of the low-rigidity metal layer 13 are shown in Table 1.

Void ratio is the proportion (%) of the area occupied by the voids 27 to the cross sectional area of the multi-layer structure 7 that is cut at right angles or parallel to the stacking direction of the multi-layer structure 7. Void ratio was measured as described below.

First, the multi-layer structure 7 was polished by known polishing means so as to reveal a section perpendicular to the stacking direction. Polishing operation may be done, for example, by using a desktop polishing machine KEMET-V-300 available from KEMET Japan Inc. and a diamond paste. Void ratio can be measured by, observing the section exposed by this polishing operation, under a scanning electron microscope (SEM), optical microscope, metallurgical microscope or the like and processing an image of the section taken in this observation.

the same composition. On the other hand, in, the multi-layer piezoelectric elements 1 of examples No. 2 to No. 4, the low-rigidity metal layer 13 was formed due to the diffusion of silver. Also it can be seen that void ratio of the low-rigidity metal layer 13 was 80% in contrast to the void ratio of 15% in the metal layer 11, and that the low-rigidity metal layer 13 of lower rigidity than those of the metal layer 11 and the piezoelectric material layer 3 could be formed.

A shown in Table 1, observation with SEM showed that in example No. 2, all metal parts 15 of one low-rigidity metal layer 13 were bonded with only one (the lower piezoelectric material layer 3 in the case shown in FIG. 5) of the two piezoelectric material layers 3 that adjoin in the stacking direction as shown in FIG. 5. This is because the bonding material 19 was mixed only in one of the two piezoelectric material layers 3 that adjoin the low-rigidity metal layer 13 in the stacking direction.

In sample No. 3, the plurality of the metal parts 15 in the low-rigidity metal layer 13 was bonded with only the different piezoelectric material layer 3 among the two piezoelectric material layers 3 that adjoined in the stacking direction as shown in FIG. 6. This is because the bonding material 19 was mixed in both of the two piezoelectric material layers 3 that adjoin the low-rigidity metal layer 13 in the stacking direction.

In example No. 4, part of the plurality of metal parts 15 of the low-rigidity metal layer 13 was bonded via the bonding material 19 with both of the two piezoelectric material layers 3 that adjoin in the stacking direction as shown in FIG. 7. This is because the bonding material 19 mixed in the electrically conductive paste diffused along with silver.

Then operation was evaluated. Evaluation of operation was made on high-speed response and durability.

First, lead wires were connected to the external electrodes 9, and DC electric field of 3 kV/mm was applied between the external electrodes 9 of positive and negative polarities via the lead wires so as to apply polarization treatment for 15 minutes, thereby to make the piezoelectric actuator based on the multi-layer piezoelectric element 1. When a DC voltage of 170 V was applied to the multi-layer piezoelectric element 1 thus obtained to measure the amount of displacement in the initial condition, the piezoelectric actuator of example No. 1 underwent displacement of 45 μm and the piezoelectric actuators of examples No. 2 to No. 4 underwent displacement of 40 μm. The piezoelectric actuator of example No. 1 underwent greater displacement than the piezoelectric actuators of

TABLE 1

| | Internal electrode | | | Low-rigidity metal layer | | | |
| --- | --- | --- | --- | --- | --- | --- | --- |
| Example No. | Metal composition of paste printed | Metal composition after firing | Void ratio (%) | Metal composition of paste printed | Metal composition after firing | Void ratio (%) | Form |
| 1 | Ag 95% Pd 5% | Ag 95% Pd 5% | 25 | — | — | — | — |
| 2 | Ag 95% Pd 5% | Ag 96% Pd 4% | 15 | Ag 98% Pd 2% | Ag 96% Pd 4% | 80 | FIG. 5 |
| 3 | Ag 95% Pd 5% | Ag 96% Pd 4% | 15 | Ag 98% Pd 2% | Ag 96% Pd 4% | 80 | FIG. 6 |
| 4 | Ag 95% Pd 5% | Ag 96% Pd 4% | 10 | Ag 98% Pd 2% ($SiO_2$ is added) | Ag 96% Pd 4% | 80 | FIG. 7 |

A shown in Table 1, the low-rigidity metal layer 13 was not formed in the multi-layer piezoelectric element 1 of example No. 1 since it employed the electrically conductive paste of the other examples because the low-rigidity metal layers 13 did not serve as the internal electrodes 11 in the multi-layer piezoelectric elements 1 of examples No. 2 to No. 4.

High-speed response was evaluated by applying AC voltage in a range from 0 to +170 V to each piezoelectric actuator with frequency being increased from 150 Hz gradually upward at the room temperature. Durability was evaluated by applying AC voltage to each piezoelectric actuator in a range from 0 to +170 V at a frequency of 150 Hz at the room temperature, to carry out continuous operation test of $1\times10^9$ cycles. Results of the test are shown in Table 2.

TABLE 2

| Example No. | Amount of displacement at initial state (μm) | Harmonics noise | Beat at 1 kHz or higher | Amount of displacement after $1 \times 10^9$ cycles (μm) | Peel off between layers after continuous operation ($1 \times 10^9$ cycles) |
|---|---|---|---|---|---|
| 1 | 45 | Present | Present | 5 | Present |
| 2 | 40 | None | None | 35 | None |
| 3 | 40 | None | None | 38 | None |
| 4 | 40 | None | None | 40 | None |

As shown in Table 2, the piezoelectric actuator of example No. 1 generated beating sound when the frequency exceeded 1 kHz during high-speed response evaluation test. This is because the multi-layer piezoelectric element 1 of the example No. 1 was not provided with the low-rigidity metal layer 13, and therefore the internal electrodes 11 exerted greater restrictive force on the piezoelectric material layer 3. It is supposed that the greater restrictive force on the piezoelectric material layer 3 compromised the high-speed response, and the piezoelectric material layer could not act at the frequency of the alternate voltage applied.

Pulse waveform of the piezoelectric actuator of example No. 1 was observed on an oscilloscope DL1640L manufactured by Yokogawa Electric Corporation to check the drive frequency. Harmonics noise was observed at frequencies of integral multiples of the drive frequency.

The piezoelectric actuator of example No. 1 underwent displacement of 5 μm after durability test, nearly 90% less than the level it showed before the test, as shown in Table 2. A part of the multi-layer piezoelectric element peeled off in the piezoelectric actuator of example No. 1.

The piezoelectric actuators of examples No. 2 to No. 4, in contrast, showed no peel-off, and underwent displacement of 35 to 40 μm after the durability test, the amount decreasing by less than 10% from the level achieved before the test. The piezoelectric actuator of example No. 4, in particular, showed no substantial decrease in the amount of displacement, proving that it had very high durability.

The invention claimed is:

1. A multi-layer piezoelectric element comprising a multi-layer structure in which a plurality of piezoelectric material layers and a plurality of metal layers are stacked alternately one on another,
wherein the plurality of metal layers comprise internal electrodes and low-rigidity metal layer that has rigidity lower than those of the piezoelectric material layer and the internal electrode,
wherein the low-rigidity metal layer comprises a plurality of metal parts that are separated from each other,
wherein at least one of the metal parts is bonded with only one piezoelectric material layer among the two piezoelectric material layers that adjoin in the stacking direction,
wherein the piezoelectric material layer comprises a plurality of piezoelectric crystal grains, and
wherein a portion of the metal part is bonded with at least two of the piezoelectric crystal grains.

2. The multi-layer piezoelectric element according to claim 1, wherein voids exist between the metal parts.

3. The multi-layer piezoelectric element according to claim 1, wherein the metal part is separated from the other piezoelectric material layer among the two piezoelectric material layers that adjoin in the stacking direction.

4. The multi-layer piezoelectric element according to claim 1, wherein the portion of the metal part infiltrates between the piezoelectric crystal grains, and
wherein the portion of the metal part has a wedge shape.

5. The multi-layer piezoelectric element according to claim 1, wherein the portion of the metal part infiltrates between the piezoelectric crystal grains, and the piezoelectric material layer further comprises a bondingmaterial that is disposed between the plurality of piezoelectric crystal grains and bonds the adjacent piezoelectric crystal grains, and
wherein the metal parts are bonded with the bonding material.

6. The multi-layer piezoelectric element according to claim 5, wherein the bonding material contains glass as a main component.

7. The multi-layer piezoelectric element according to claim 5, wherein the bonding material contains a main component of the metal part.

8. The multi-layer piezoelectric element according to claim 7, wherein the bonding material contains oxide of the main component of the metal part.

9. An ejection apparatus comprising:
a container comprising an ejection hole; and
the multi-layer piezoelectric element according to claim 1 housed in the container,
wherein the ejection apparatus configured to eject a liquid filled in the container through the ejection hole by an operation of the multi-layer piezoelectric element.

10. A fuel ejection system comprising:
a common rail that stores a high-pressure fuel;
an ejection apparatus according to claim 9 that ejects the fuel stored in the common rail;
a pressure pump that supplies the high pressure fuel to the common rail; and
an ejection control unit that supplies a drive signal to the ejection apparatus.

11. A multi-layer piezoelectric element comprising a multi-layer structure in which a plurality of ceramic layers and a plurality of internal electrodes are stacked alternately one on another,
wherein the plurality of ceramic layers comprise piezoelectric material layers and low-rigidity ceramic layer that has rigidity lower than those of the piezoelectric material layer and the internal electrode,
wherein the low-rigidity ceramic layer comprises a plurality of ceramic parts that are separated from each other, and wherein at least one of the ceramic parts is bonded with only one piezoelectric material layer of the two piezoelectric material layers that adjoin in the stacking direction.

12. The multi-layer piezoelectric element according to claim 11, wherein voids exist between the ceramic parts.

13. The multi-layer piezoelectric element according to claim 11, wherein the ceramic part is separated from the other piezoelectric material layer among the two piezoelectric material layers that adjoin in the stacking direction.

* * * * *